(12) United States Patent
Horng et al.

(10) Patent No.: US 8,057,925 B2
(45) Date of Patent: Nov. 15, 2011

(54) LOW SWITCHING CURRENT DUAL SPIN FILTER (DSF) ELEMENT FOR STT-RAM AND A METHOD FOR MAKING THE SAME

(75) Inventors: Cheng T. Horng, San Jose, CA (US); Ru-Ying Tong, Los Gatos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 269 days.

(21) Appl. No.: 12/079,445

(22) Filed: Mar. 27, 2008

(65) Prior Publication Data

US 2009/0246557 A1    Oct. 1, 2009

(51) Int. Cl.
*G11B 5/39* (2006.01)

(52) U.S. Cl. .......... 428/811; 428/811.1; 428/811.2; 428/811.3; 428/811.4; 428/811.5; 365/158; 365/171; 365/173

(58) Field of Classification Search .......... 257/421; 428/827–829
See application file for complete search history.

(56) References Cited

U.S. PATENT DOCUMENTS

| | | | |
|---|---|---|---|
| 7,180,713 B2 | 2/2007 | Nagasaka et al. | |
| 2005/0185455 A1* | 8/2005 | Huai | 365/171 |
| 2005/0276099 A1* | 12/2005 | Horng et al. | 365/158 |
| 2007/0045758 A1* | 3/2007 | Cao et al. | 257/421 |
| 2007/0085068 A1 | 4/2007 | Apalkov et al. | |
| 2007/0171694 A1 | 7/2007 | Huai et al. | |
| 2008/0180991 A1* | 7/2008 | Wang | 365/171 |

OTHER PUBLICATIONS

"Current-driven excitation of magnetic multilayers," by Slonczewski, Journal of Magnetism and Magnetic Materials, V 159(1996) L1-L7, Elsevier Science B.V.

"A Novel Nonvolatile Memory with Spin Torque Transfer Magnetization Switching: Spin-RAM," by Hosomi et al., 2005 IEDM, paper 19-1.

"Composite free layer for high denstiy magnetic random access memory with lower spin transfer current," by Meng et al., Applied Physics Letters 89, 152509 (2006), pp. 1-3, 2006 American Institute of Physics.

"Current-induced magnetization switching in MgO barrier based magnetic tunnel junctions with CoFeB/Ru/CoFeB synthetic ferrimagnetic free layer," by J. Hayakawa et al., found, j-hayakawa@rd.hitachi.co.jp.

(Continued)

*Primary Examiner* — Holly Rickman
*Assistant Examiner* — Linda Chau
(74) *Attorney, Agent, or Firm* — Saile Ackerman LLC; Stephen B. Ackerman

(57) ABSTRACT

A dual spin filter that minimizes spin-transfer magnetization switching current (Jc) while achieving a high dR/R in STT-RAM devices is disclosed. The bottom spin valve has a MgO tunnel barrier layer formed with a natural oxidation process to achieve low RA, a CoFe/Ru/CoFeB—CoFe pinned layer, and a CoFeB/FeSiO/CoFeB composite free layer with a middle nanocurrent channel (NCC) layer to minimize $Jc_0$. The NCC layer may have be a composite wherein conductive M(Si) grains are magnetically coupled with adjacent ferromagnetic layers and are formed in an oxide, nitride, or oxynitride insulator matrix. The upper spin valve has a Cu spacer to lower the free layer damping constant. A high annealing temperature of 360° C. is used to increase the MR ratio above 100%. A $Jc_0$ of less than $1\times10^6$ A/cm$^2$ is expected based on quasistatic measurements of a MTJ with a similar MgO tunnel barrier and composite free layer.

11 Claims, 2 Drawing Sheets

OTHER PUBLICATIONS

"Enhanced Gilbert Damping in Thin Ferromagnetic Films," by Y. Tserkovnyak et al., Physical Review Letters, vol. 88, No. 11, Mar. 18, 2002, 1176071-0 to 1176071-4, 2002 The American Physical Society.

"Spin transfer switching in dual MgO magnetic tunnel junctions," by Diao et al., Applied Physics Letters 90, 132508-1 to 132508-3 (2007), 2007 The American Institute of Physics.

"Current-Driven Magnetization Switching in CoFeB/MgO/CoFeB Magnetic Tunnel Junctions," by Hayakawa et al., Japanese Journal of Applied Physics, vol. 44, No. 41, 2005, pp. L1267-L1270.

"2Mb Spin-Transfer Torque RAM (SPRAM) with Bit-by-Bit Bidirectional Current Write and Parallelizing-Direction Current Read," by Kawahara et al., ISSCC 2007 / Session 26 / Non-Volatile Memories / 26.5, 2007 IEEE Int'l Solid-State Circuits Conference.

"Spin transfer switching current reduction in magnetic tunnel junction based dual spin filter structures," by Huai et al., Applied Physics Letters 87, 222510-1 to 222510-3, 2005 American Institute of Physics.

"Magnetic Damping in Ferromagnetic Thin Films," by Oogane et al., Japanese Journal of Applied Physics, vol. 45, No. 5A, 2006, pp. 3889-3891, Selected Topics in Applied Physics IV.

"Multilayer configuration for experiments of spin precession induced by a dc current," by Berger, Journal of Applied Physics, vol. 93, No. 10, May 15, 2003, pp. 7693-7695, 2003 American Institute of Physics.

Co-pending US Patent HMG07-046/052, U.S. Appl. No. 12/082,155, filed Apr. 9, 2008, "A Low Switching Current MTJ Element for Ultra-High STT-RAM and a Method for Making the Same," assigned to the same assignee as the present invention.

Co-pending US Patent HMG06-040, U.S. Appl. No. 11/717,347, filed Mar. 13, 2007, Spin Transfer MRAM Device with Novel Magnetic Free Layer, assigned to the same assignee as the present invention.

\* cited by examiner

LOW SWITCHING CURRENT DUAL SPIN FILTER (DSF) ELEMENT FOR STT-RAM AND A METHOD FOR MAKING THE SAME

RELATED PATENT APPLICATION

This application is related to the following: Ser. No. 12/082,155, filing date Apr. 9, 2008, and Ser. No. 11/717,347, filing date Mar. 13, 2007; both assigned to a common assignee and herein incorporated by reference in their entirety.

FIELD OF THE INVENTION

The invention relates to a high performance Magnetic Tunneling Junction (MTJ) element and a method for making the same, and in particular, to a dual spin filter element for a STT-RAM device that achieves low switching current, an acceptable RA value, and high dR/R by incorporating a nanocurrent channel FeSiO layer in a composite free layer and a MgO tunnel barrier layer.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-RAM on a gigabit scale.

Both MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_S$) value are desirable for conventional MRAM applications. For Spin-RAM (STT-RAM), a high $\lambda_S$ and high Hc leads to high anisotropy for greater thermal stability. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance x area (RA) value and a high breakdown voltage (Vb), it is necessary to have a uniform tunnel barrier layer which is free of pinholes that is promoted by a smooth and densely packed growth in the AFM and pinned layers. RA should be relatively small (about 4000 ohm-$\mu m^2$ or less) for MTJs that have an area defined by an easy axis and hard axis dimensions of less than 1 micron. Otherwise, R would be too high to match the resistance of the transistor which is connected to the MTJ.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and nonmagnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

In order for STT-RAM to be viable in the 90 nm technology node and beyond, MTJs must exhibit a TMR ratio that is much higher than in a conventional MRAM-MTJ which uses AlOx as the tunnel barrier and a NiFe free layer. Furthermore, the critical current density (Jc) must be lower than $10^6$ A/cm$^2$ to be driven by a CMOS transistor that can typically deliver 100 μA per 100 nm gate width. A critical current for spin transfer switching (Ic), which is defined as [(Ic$^+$+Ic$^-$I)/2], for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgOx, or the like. Thus, for high density devices such as STT-RAM on a gigabit scale, it is desirable to decrease Ic (and its Jc) by more than an order of magnitude so as to avoid an electrical breakdown of the MTJ device and to be compatible with the underlying CMOS transistor that is used to provide switching current and to select a memory cell.

Once a certain MTJ cell has been written to, the circuits must be able to detect whether the MTJ is in a high or low resistance state which is called the "read" process. Uniformity of the TMR ratio and the absolute resistance of the MTJ cell are critical in MRAM (and STT-RAM) architecture since the absolute value of MTJ resistance is compared with a reference cell in a fixed resistance state during read mode. Needless to say, the read process introduces some statistical difficulties associated with the variation of resistances of MTJ cells within an array. If the active device resistances in a block of memory show a large resistance variation (i.e. high Rp_cov, Rap_cov), a signal error can occur when they are compared with a reference cell. In order to have a good read operation margin, TMR/Rp_cov (or Rap_cov) should have a minima of 12, preferably >15, and most preferably >20 where Rp is the MTJ resistance for free layer magnetization aligned parallel to pinned layer magnetization (which is fixed) and Rap is the resistance of free layer magnetization aligned anti-parallel to the pinned layer magnetization.

The intrinsic critical current density (Jc) as given by Slonczewski of IBM is shown in the following equation (1):

$$Jc=2e\alpha Mst_F(Ha+H_k+2\pi Ms)/h\eta \quad (1)$$

where e is the electron charge, α is a Gilbert damping constant, $t_F$ is the thickness of the free layer, h is the reduced Plank's constant, η is the spin-transfer efficiency which is related to the spin polarization (P), Ha is the external applied field, and $H_k$ is the uniaxial anisotropy field, and 2π Ms is the demagnetization field of the free layer.

Normally, the demagnetizing field, 2πMs (several thousand Oe term) is much larger than the uniaxial anisotropy field Hk and external applied field (about 100 Oe) Ha term, hence the effect of Hk and Ha on Jc are small. In equation (2), V equals MS($t_F$A) and is the magnetic volume which is related to the thermal stability function term $K_uV/k_bT$ where $K_u$ is the magnetic anisotropy energy and $k_b$ is the Boltzmann constant.

$$Jc \propto \alpha MsV/h\eta \quad (2)$$

Referring to FIG. 1, a STT-RAM structure 1 is shown and includes a gate 5 formed above a p-type semiconductor substrate 2, a source 3, drain 4, word line (WL) 6, bottom electrode (BE) 7, and bit line (BL) 9. There is also a MTJ element 8 formed between the bit line 9 and bottom electrode 7, and a via 10 for connecting the BE to the drain 4.

Another publication relating to a STT-RAM (Spin-RAM) structure is by M. Hosomi et al. in "A novel non-volatile memory with spin torque transfer magnetization switching: Spin-RAM", 2005 IEDM, paper 19-1, and describes a 4 Kbit Spin RAM having CoFeB pinned and free layers, and a RF-sputtered MgO tunnel barrier that was annealed under 350° C. and 10000 Oe conditions. The MTJ size is 100 nm×150 nm in an oval shape. The tunnel barrier is made of crystallized (001) MgO with a thickness controlled to <10 Angstroms for a proper RA of around 20 ohm-μm$^2$. Intrinsic dR/R of the MTJ stack is 160% although dR/R for the 100 nm×150 nm bit during read operation (with 0.1 V bias) is about 90% to 100%. Using a 10 ns pulse width, the critical current density, Jc, for spin transfer magnetization switching is around 2.5×10$^6$ A/cm$^2$. Write voltage distribution on a 4 Kbit circuit for high resistance state to low resistance (P to AP) and low resistance state to high resistance state (AP to P) has shown good write margin. Resistance distribution for the low resistance state (Rp) and high resistance state (Rap) has a sigma (Rp_cov) of about 4%. Thus, for a read operation, TMR (with 0.1 V bias)/Rp_cov is >20.

J. Hayakawa et al. in "Current Driven Magnetization Switch in CoFeB/MgO/CoFeB Magnetic Tunnel Junctions", Japan J. Appl. Phys., Vol. 41, p. 1267 (2005), report a Jc (10 ns pulse width) of ~2.5×10$^6$ A/cm$^2$ for a MTJ processed with 350° C. annealing and having a MgO tunnel barrier which results in a RA of about 10 ohm-cm$^2$ and a MR (intrinsic) of around 160%. J. Hayakawa et al. in "Current-induced magnetization switching in MgO barrier based magnetic tunnel junctions with CoFeB/Ru/CoFeB synthetic ferromagnetic free layer", j-hayakawa@rd.hitachi.co.jp, report a Jc$_0$ of 8.9×10$^6$ A/cm$^2$ for a 80 nm×160 nm oval shaped MTJ processed with 300° C. annealing which results in dR/R=90% and a thermal stability factor E/k$_B$T>60.

A 2 Mb spin-transfer torque RAM (SPRAM) was described by T. Kawahara et al. in "2 Mb spin-transfer torque RAM with bit-by-bit bidirectional current write and parallelizing-direction current read", 2007 IEEE International Solid State Circuits Conference, and has a CoFe(B)/MgO/CoFe—NiFe MTJ (100 nm×50 nm oval shape) with a switching voltage by quasistatic measurement of about 0.7 V and a Jc$_0$ estimated to be >2.5×10$^6$ A/cm$^2$.

Y. Huai et al. in "Spin transfer switching current reduction in magnetic tunnel junction based dual spin filter structures", Appl. Phys. Lett. V 87, p 222510(2005), report that a dual spin filter (DSF) shows that a second pinned layer creates additional spin transfer torque which helps to switch free layer magnetization. The Jc$_0$ value is reduced by a factor of 3× to ~2.2×10$^6$ A/cm$^2$.

Z. Diao et al. in "Spin transfer switching in dual MgO magnetic tunnel junctions", APL, Vol. 90, pp. 132508 (2007) demonstrated that although a DSF structure reduces Jc$_0$ by a factor of 2× compared with a single spin valve, the dR/R suffers by decreasing to about one half the value of a conventional MTJ.

H. Meng and J. Wang in "Composite free layer for high density magnetic random access memory with low spin transfer current", APL Vol. 89, pp. 152509 (2006), show that a composite free layer with a nanocurrent (NCC) FeSiO layer sandwiched between two CoFe layers is capable of reducing Jc$_0$ to 8×10$^6$ A/cm$^2$ from 2.4×10$^7$ A/cm$^2$ for a MTJ with a CoFe free layer.

In summary, the prior art suggests that (a) Jc$_0$>2×10$^6$ A/cm$^2$ for a conventional MgO-MTJ fabricated with a single "barrier" layer; (b) there is a >2× reduction in Jc$_0$ for a dual spin filter MTJ having two anti-parallel pinned layers; (c) a MTJ fabricated with a NCC free layer can achieve considerably lower Jc$_0$; and (d) dR/R (MR) of a DSF MTJ or a NCC free layer containing MTJ is reduced considerably so that read operational margin of the devices is too small to satisfy the STT-RAM product requirements. For example, in advanced STT-RAM devices having a 1 Gbit density and a 100 nm×150 nm oval size MTJ, Rp_cov is typically about 5% which means dR/R must be at least 100% in order to achieve the desired TMR/Rp_cov ratio of ≧20. Therefore, further improvement in STT-RAM technology is necessary before a viable product based on the 90 nm technology node is achieved. In particular, a combination of a high TMR ratio, TMR/Rp_cov ratio >20, and a low Jc of less than $2 \times 10^6$ $A/cm^2$ is needed.

U.S. Patent Application No. 2007/0085068 teaches a MTJ with a composite free layer switched by spin transfer and comprised of at least one layer of CoFeB and a granular layer having grains in a matrix. The granular layer may be represented by $TM_y Oxide_{(100-y)}$ where TM is one of Ni, Fe, and Co, and the oxide includes at least one of AlOx, SiOx, TiOx, TaOx, ZrOx, HfOx, MgO, and y is between 5 and 50 atomic %.

In U.S. Patent Application No. 2007/0171694, one or more spin diffusion layers are disposed next to the free layer and outside a structure formed by the pinned layer, free layer, and middle layer between the free and pinned layers. A spin diffusion layer is employed to reduce the spin transfer switching current.

U.S. Pat. No. 7,180,713 teaches a granular structure layer formed in a free layer in which the conductive particles are made of a magnetic metal material thereby reducing the sense current path so that the element output can be increased.

SUMMARY OF THE INVENTION

One objective of the present invention is to provide a DSF element for a STT-RAM that has a RA value less than 50 ohm-µm$^2$ and an intrinsic dR/R >120% in order to achieve a dR/R (0.1V bias) >80% so that TMR/Rp_cov is >20 when Rp_cov is ~4%.

A second objective of the present invention is to provide a DSF element in a STT-RAM according to the first objective that also has an intrinsic switching current density ($Jc_0$) of less than $1 \times 10^6$ $A/cm^2$.

According to one embodiment, these objectives are achieved by providing a substrate comprised of a bottom conductor electrode on which a spin-transfer (STT)-RAM structure is to be fabricated. In order to achieve a high density STT-RAM on a gigabit scale, the bottom electrode is preferably disposed on a via stud that is formed in a first dielectric layer. Typically, the via stud contacts a transistor drain in a sub-structure. A MTJ element is formed by first depositing a stack of layers on the bottom conductor electrode. Preferably, the MTJ stack has a dual spin filter (DSF) configuration in which a seed layer, first AFM layer, first pinned layer, tunnel barrier layer, free layer, spacer, second pinned layer, second AFM layer, and a capping layer are sequentially formed on the bottom electrode. The first pinned layer may be a synthetic anti-ferromagnetic (SyAF) layer. The tunnel barrier layer is preferably comprised of crystalline MgO made by a natural oxidation (NOX) or radical oxidation (ROX) method. Above the tunnel barrier layer is a free layer that is a composite comprised of a nanocurrent channel (NCC) layer sandwiched between two CoFeB layers or between two CoFe layers. The spacer is a non-magnetic layer made of Cu or the like, and the second pinned layer may be a single CoFe layer that is pinned in a direction anti-parallel to that of the first pinned layer.

Once all the layers in the stack are laid down and thermally annealed to fix the pinned layer magnetization (easy-axis) direction, a patterning and etching sequence is followed to fabricate a MTJ cell.

In one embodiment, a first photoresist layer is formed on the capping layer and is patterned to define an array of island shapes from a top-view. The islands may be shaped in the form of an oval, eye, or another rounded shape. Next, a reactive ion etch (RIE) process is employed to etch through portions of the capping layer that are not covered by the first photoresist layer. In one scheme, the photoresist layer is removed and then the capping layer serves as a hard mask during a second RIE process where the island shape pattern in the capping layer is transferred through the remaining layers in the DSF stack and stops on the first dielectric layer. As a result, a DSF element comprised of a lower MTJ section and an upper GMR section is formed with sidewalls and a top surface. To complete the STT-RAM structure, a second dielectric layer such as silicon oxide is deposited on the DSF structure and surrounding substrate which is the first dielectric layer. A chemical mechanical polish (CMP) process is used to expose the capping layer and make the second dielectric layer coplanar with the top of the DSF element. A bit line array is then formed on the second dielectric layer by depositing a conductive layer followed by employing a photolithography patterning and RIE sequence to delineate a bit line on the hard mask.

DETAILED DESCRIPTION OF THE INVENTION

Figure 1:
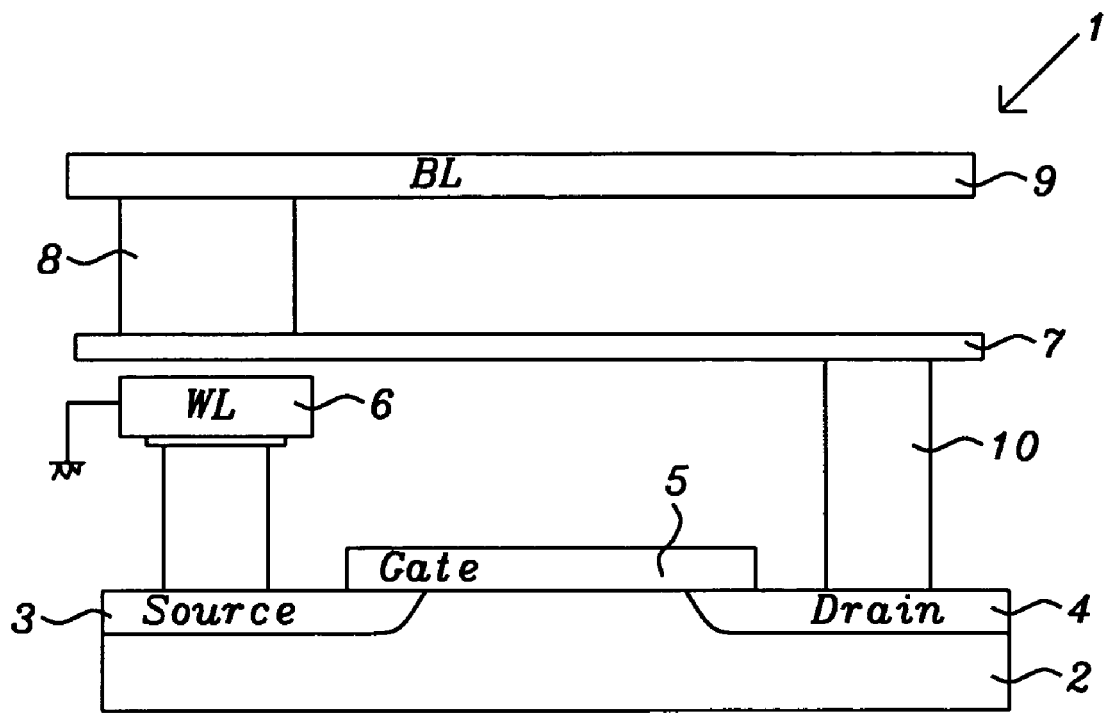
FIG. 1 is a cross-sectional view showing a memory cell in a conventional STT-RAM device.

The present invention is a dual spin filter (DSF) element that enables a combination of high dR/R and low critical current density necessary for enhanced performance in spin transfer (STT-RAM) applications. In theory, a 6× reduction in $Jc_0$ may be possible with a DSF structure compared with a single spin value but only a 2× to 3× reduction has been realized in the prior art. The present invention also provides a fabrication sequence for a STT-RAM device on an ultra high density scale. Drawings are provided by way of example and are not intended to limit the scope of the invention.

The inventors have previously fabricated a dual spin filter for a STT-RAM device as described in MagIC patent application HMG06-040. In particular, a stack configuration represented by BE/NiCr50/MnPt150/CoFe23/Ru7.5/CoFeB15-CoFe6/MgO/CoFeB—Ta6-CoFeB/Cu25/CoFe30/MnPt150/Ta was employed to lower intrinsic critical current density compared with a single spin valve. The various layers are shown from bottom to top and include a BE (bottom electrode), NiCr seed layer, MnPt (AFM) layers, CoFe/Ru/CoFeB—CoFe as a first pinned layer, MgO tunnel barrier, CoFeB/Ta/CoFeB free layer, Cu spacer, CoFe second pinned layer, and a Ta capping layer with the numbers indicating thickness values. The two pinned layers are aligned in an anti-parallel configuration. The MgO tunnel barrier was formed by first depositing an 8 Angstrom thick Mg layer, oxidizing with a NOX or ROX process, and then depositing a second Mg layer (4 Angstrom thick) on the oxide to achieve a RA value <50 ohm-µm$^2$. A relatively low post deposition annealing temperature of 265° C. was used to provide an amorphous CoFeB free layer that has a low damping property.

A summary of the magnetic performance properties of a DSF structure with a Ta insertion layer is provided in Table 1 and compared with a similar DSF without an insertion layer in the free layer. Annealing was performed at 265° C. for 2 hours.

TABLE 1

Magnetic Properties of STT-RAM MTJs with NiCr45/MnPt150/
$Co_{75}Fe_{25}23/Ru7.5/Co_{40}Fe_{40}B_{20}15$—$Co_{75}Fe_{25}6/MgO/$
FL/Cu/$Co_{75}Fe_{25}21$/MnPt150/Ru configuration

| Row | FL (free layer) | Spacer/pinned | RA | dR/R | Bs | Hc | Hin | Hk |
|---|---|---|---|---|---|---|---|---|
| 1 | CoFeB18 | none | 9.5 | 115% | 0.51 | 10.7 | 3.8 | 34 |
| 2 | CoFeB17 | Cu30/CoFe21 | 8.0 | 58% | 0.63 | 9.2 | −2.6 | 22 |
| 3 | CoFeB15 | Cu30/CoFe21 | 8.0 | 51% | 0.54 | 9.3 | −5.2 | 23 |
| 4 | CoFeB20/Ta6/CoFeB5 | Cu25/CoFe21 | 7.8 | 106% | 0.55 | 12.5 | 4.7 | 31 |

Row 1 shows results for a conventional MTJ in which the free layer is $Co_{40}Fe_{40}B_{20}$. Rows 2 and 3 are DSF structures fabricated with a single CoFeB free layer as described in MagIC patent application HMG06-040. Note that the MR ratio (dR/R) decreases to about one half that of Row 1. In Row 4, the composite free layer consists of a thin Ta insertion layer between two CoFeB layers. The inventors discovered that the MR ratio for the novel DSF structure in Row 4 is restored to a high value equivalent to dR/R in Row 1 for a conventional MTJ with single CoFeB free layer.

Using a test structure design, a conventional MTJ and DSF devices were fabricated from row 1, 3, and 4 structures, respectively. Spin transfer induced magnetization switching (writing) is measured by using bi-directional voltage (current) pulses applied to the device bit line in which pulse width is 30 ms (i.e. quasistatic test). MR ratios measured for a 100 nm×200 nm oval device with 0.1V bias are 70%, 40%, and 70%, respectively. Average switching voltage Vsw_ave [(Vsw$^+$+Vsw$^-$)/2] equal to 0.8V was observed for the conventional MTJ (Row 1 structure) while Vsw_ave for the DSF (1) in Row 3 and DSF(2) in Row 4 were 0.4V and 0.6V, respectively. These results confirm that Vsw (and Jc) for the conventional MTJ is 2× that of DSF(1) but the DSF(1) structure suffers from a much smaller MR ratio. Although the DSF(2) has a MR ratio equivalent to that of the conventional MTJ, Jc reduction is not as significant as for DSF(1). It is believed that the less significant Jc reduction for DSF(2) is due to enhanced damping from Ta insertion into the free layer. This Ta damping effect has been described by Y. Tserkovnyak et al. in "Enhanced Gilbert Damping in Thin Ferromagnetic Film", PRL vol. 88, pp. 117601-1 (2002) where the damping constant for a NiFe/Ta bilayer is at least 2× larger than for a NiFe/Cu bilayer. Therefore, to achieve a low damping effect, the spacer layer selected for the top spin valve portion of a DSF structure is Cu according to the present invention.

In related MagIC patent application HMG07-046/052, a nanocurrent channel (NCC) material such as FeSiO is inserted into a free layer of a MTJ structure to improve the performance of a STT-RAM device. According to the present invention, NCC material insertion into a free layer may also be employed to improve the magnetic performance properties of a DSF structure for STT-RAM applications.

Figure 2:
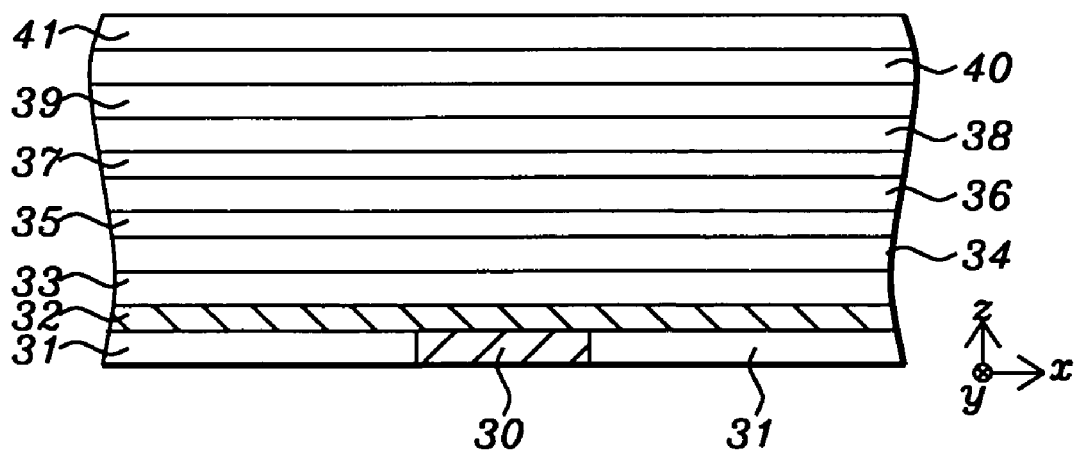
FIG. 2 is cross-sectional view of a DSF stack of layers according to one embodiment of the present invention.

Referring to FIG. 2, a cross-sectional view of a stack of layers that will be used to fabricate a DSF structure according to the present invention is illustrated. In one embodiment, a bottom electrode layer 32 and a stack of layers 33-41 are sequentially formed on a substrate comprised of a via stud 30 and an adjacent first dielectric layer 31 made of silicon oxide, alumina, or the like. It should be understood that the via stud 30 is connected to a transistor drain (not shown) in an underlying substructure. The transistor is typically used in a read process that determines the resistance state of the bit cell (DSF structure) once the stack of layers is patterned to form a DSF structure and contacts an overlying bit line. Note that unlike conventional MRAM, magnetization switching in a STT-RAM MTJ is accomplished by passing current through a DSF structure and not by fields induced by current in a word line and a bit line.

The bottom electrode layer 32 may be a composite layer comprised of a lower seed layer, middle conductive layer, and upper capping layer (not shown). Alternatively, the bottom electrode layer 32 may be a single layer made of Ta, for example, as in the preferred embodiment of the present invention. An α-Ta bottom electrode layer 32 is especially advantageous in promoting a uniform and dense growth in subsequently formed DSF layers that will yield a higher dR/R. According to one embodiment described herein, the bottom electrode layer will be subsequently patterned into a bottom electrode (sectioned line) having an elliptical shape or another rounded shape in an "x, y" plane and with a thickness in a z-axis direction.

A DSF stack of layers is now formed on the bottom electrode layer 32 and the DSF stack comprised of layers 33-41 may be formed in the same process tool as the bottom electrode layer. For instance, the bottom electrode layer 32 and DSF stack of layers 33-41 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 32 and overlying DSF layers 33-41 may be formed after a single pump down of the sputter system to enhance throughput.

The seed layer 33 may be comprised of NiCr, NiFe, NiFeCr, or other suitable seed layer materials and when grown on an amorphous Ta bottom electrode layer 32, a smooth and dense (111) seed layer structure results that promotes smooth and densely packed growth in subsequently formed DSF layers.

The AFM layer 34 is preferably made of MnPt although IrMn, NiMn, OsMn, RuMn, RhMn, PdMn, RuRhMn, or MnPtPd are also acceptable. In the exemplary embodiment, the AFM layer 34 is magnetically aligned in the x-axis direction. An external magnetic field may be applied during the deposition of a DSF layer such as an AFM layer or a ferromagnetic layer to influence a magnetization along a certain axis.

The first reference or pinned layer 35 may be a single layer comprised of a soft magnetic material such as Co, Fe, Ni, B or an alloy thereof that is pinned in the x-axis direction by the magnetic influence of the adjacent AFM layer 34. The first pinned layer 35 may also be a synthetic anti-ferromagnetic (SyAF) layer having a CoFe/Ru/CoFe or CoFe/Ru/CoFeB configuration where Ru serves as a coupling layer between the upper CoFe (or CoFeB) and lower CoFe magnetic layers that have magnetic moments aligned in an anti-parallel configuration. The present invention also anticipates that the upper magnetic layer of a SyAF pinned layer may be a composite with a CoFeB layer formed on the Ru coupling layer and a CoFe layer that contacts the tunnel barrier layer 36. Thus, the first SyAF pinned layer 35 may be represented by a CoFe/Ru/CoFeB/CoFe configuration. In one embodiment, the first pinned layer 35 has a configuration represented by $Co_{75}Fe_{25}/Ru/Co_{40}Fe_{40}B_{20}/Co_{75}Fe_{25}$ where the lower CoFe layer is from 20 to 30 Angstroms thick, the Ru coupling layer is about 7.5 Angstroms thick, the CoFeB layer has a thickness between 15 and 20 Angstroms, and the upper CoFe layer has a thickness of about 5 to 10 Angstroms.

Above the first pinned layer 35 is a thin tunnel barrier layer 36 that is preferably MgO. Unlike a method commonly used in the prior art where a MgO tunnel barrier is formed by a RF sputter deposition method, the inventors advantageously employ a procedure where a Mg layer about 6 to 8 Angstroms thick is deposited by DC-magnetron sputtering followed by an in-situ natural oxidation (NOX), and then deposition of an additional Mg layer about 3 to 5 Angstroms thick. The resulting MgO tunnel barrier is crystalline and highly (001) oriented. A NOX process is preferred over a radical oxidation (ROX) process when a RA target in the range of 10-20 ohm-$\mu m^2$ is desired since ROX processes tend to give higher RA values. The tunnel barrier layer 36 has excellent smoothness and uniformity in part because of the smooth underlying first pinned layer 35. The NOX process is preferably performed in an oxidation chamber within the sputter deposition system. NOX process conditions may be comprised of a 1 torr pressure and an oxygen flow rate of from 0.1 to 1.0 slm and preferably 1 slm for about 100 to 200 seconds to oxidize the Mg layer on the first pinned layer 35.

It is well known in the art that a spin valve made with a crystalline (001) MgO barrier layer and a CoFeB free layer is capable of delivering a higher dR/R than other barrier layer/free layer combinations such as an AlOx barrier layer with an overlying CoFe free layer. Higher dR/R is achieved as a result of coherent tunneling in which electron symmetry of the ferromagnetic electrode is preserved in tunneling through the crystalline MgO barrier. It should be noted that a MgO/CoFe barrier layer/free layer configuration will provide higher spin polarization effect due to a lower damping factor which is desirable for a STT-RAM. However, MgO/CoFeB is preferred for the barrier layer/free layer structure in order to maximize the MR ratio (dR/R).

An important feature of the present invention is the composite free layer 37 that has a FM1/NCC/FM2 configuration wherein FM1 and FM2 are ferromagnetic layers comprised of Co, Fe, Ni, B or an alloy thereof and the nanocurrent channel (NCC) layer is made of FeSiO, FeSiN, MSiO, MSiN, or MSiON where M is a metal and MSiO, MSiN, and MSiON are composites in which conductive M(Si) grains such as Fe(Si) are magnetically coupled with the adjacent FM1 and FM2 layers and are formed in an oxide, nitride, or oxynitride insulator matrix. The M(Si) grains such as Fe(Si) are typically formed in columnar shapes that may extend from the lower FM1 layer to the upper FM2 layer. High resolution transmission electron microscope (HR-TEM) measurements indicate that a FeSiO layer is grown as a smooth, flat, and continuous film. It should be understood that the FM1 and FM2 layers are ferromagnetically coupled and therefore have a magnetic moment in the same direction. For instance, the magnetization direction of the FM1 and FM2 layers may either be aligned parallel or anti-parallel to the magnetization directions of the first pinned layer 35. A small amount of B of up to about 5 atomic % may be added to a FM1 or FM2 layer comprised of Fe in order to improve thermal stability. For example, one or both of the FM1 and FM2 layers may be represented by $FeB_x$ where x is between 0 and 5 atomic %.

In one embodiment, the composite free layer 37 has a CoFeB/FeSiO/CoFeB configuration in which the FM1 and FM2 layers are preferably comprised of $Co_{40}Fe_{40}B_{20}$. The FM1 layer has a thickness from about 10 to 15 Angstroms, the FM2 layer has a thickness between 5 and 10 Angstroms, and the FeSiO layer is from 8 to 15 Angstroms thick. In the composite free layer 37 described herein, a spin current passes only through the conductive grains in the NCC (FeSiO) layer which will result in a high current density in the conductive magnetic grains and thus induce magnetic switching in the M(Si) portion of the NCC layer. Thermal heating caused by a localized high current density may also contribute to magnetization switching in the M(Si) grains. Because the M(Si) grains in NCC layer are capable of undergoing magnetization switching (reversal), and are coupled to FM1 and FM2 layers, the magnetization switching of FM1 and FM2 layers such as CoFeB will be much easier than when a NCC layer is not present in the free layer. Optionally, the FM1 and FM2 layers may be comprised of CoFe that has a $Co_xFe_{(100-X)}$ composition in which X is from about 20 to 40 atomic %

There is a thin non-magnetic spacer 38 formed on the free layer 37. The spacer 38 may be made of Cu, for example, with a thickness of about 20 to 30 Angstroms and is employed to provide a low damping effect in the top spin valve of the DSF structure. Note that the DSF structure in the present invention includes a bottom spin valve (MTJ) comprised of layers 33-37 and a top spin valve based on a giant magnetoresistance (GMR) effect that has layers 37-41 in which free layer 37 is common to both bottom and top spin valves.

Above the spacer 38 is disposed a second pinned layer 39 which may have a single layer or composite configuration similar to first pinned layer 35. In the exemplary embodiment, the second pinned layer 39 is preferably made of CoFe, and more preferably, is comprised of $Co_{90}Fe_{10}$ in order to optimize dR/R for the DSF structure. The second pinned layer 39 is aligned anti-parallel to the magnetization direction of the first pinned layer 35. Second pinned layer 39 is pinned by an adjacent second AFM layer 40 that may be made of the same material as in the first AFM layer 34.

The capping layer 41 may be made of Ru, Ta, Ru/Ta, Ru/Ta/Ru or other capping layer materials used in the art. As described in related MagIC application HMG07-046/052, a substantial reduction in Jc occurs when a thin (5-10 Angstrom thick) Ru layer is employed as a capping layer due to the strong spin scattering effect of Ru. A Ta layer may be formed on the Ru layer to afford a composite Ru/Ta capping layer in which the Ta serves as a hard mask during subsequent processing steps. Thus, there will be an enhanced spin accumulation at the interface between the FM1 layer and NCC layer, and at the interface between NCC layer and the FM2 layer. The enhanced spin accumulation will increase the polarized current inside the composite free layer 37 and thereby produce an additional spin torque to act on the free layer magnetization.

Figure 3:
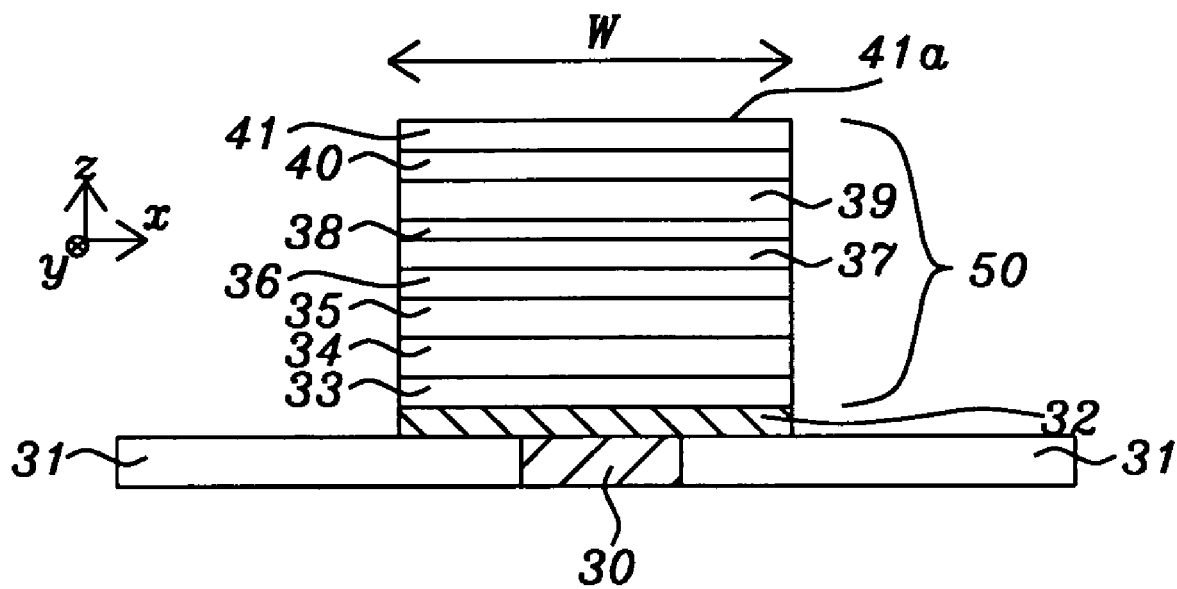
FIG. 3 is a cross-sectional view of a partially formed STT-RAM that has a dual spin filter element formed on a bottom electrode according to one embodiment of the present invention.

Another key aspect of the present invention is a high temperature annealing process after all of the DSF layers have been deposited and before the DSF cell 50 in FIG. 3 is patterned. The inventors have discovered that a high temperature anneal of from 330° C. to 360° C., and preferably 360° C. is necessary to achieve a crystalline CoFeB pinned layer and crystalline CoFeB free layer adjacent to the MgO tunnel barrier and a high MR ratio of about 100% in the DSF structures described herein. Lower temperatures as shown in Table 1 in a later section do not yield a satisfactory MR ratio with a DSF configuration because CoFeB retains an amorphous character. On the other hand, temperatures significantly above 360° C. cause Mn in the MnPt AFM layers to migrate through adjacent layers and into the MgO barrier layer which degrades device performance. For example, in the exemplary embodiment, the MTJ stack of layers may be annealed in a vacuum by applying a magnetic field of 5000 to 10000 Oe in magnitude along the x-axis (easy axis) for 1 to 5 hours at a temperature of about 330° C. to 360° C., and preferably 2 hours at 360° C. to ensure that the CoFeB FM1 and FM2 free layers are highly crystalline.

The present invention also encompasses an embodiment wherein the position of the tunnel barrier layer 36 and the spacer 38 are switched. In other words, the DSF configuration may be represented by seed/AFM1/pinned layer 1/spacer/free layer/tunnel barrier layer/pinned layer 2/AF2/cap. The overall MR ratio for the DSF structure is expected to remain unchanged if the positions of the tunnel barrier 36 and spacer 38 are switched since the MR ratio is essentially the difference between the dR/R of the GMR section (including free layer and spacer) and the dR/R of the MTJ section that includes the free layer and tunnel barrier layer.

Referring to FIG. 3, the DSF stack of layers is fabricated into a DSF cell 50 having sidewalls and a top surface 41a that has a track width w along an easy axis (x-axis) direction. From a top down view (not shown), the DSF cell 50 may be in the form of an ellipse having a long axis (x-axis) and a short axis (y-axis). Optionally, the shape of the DSF cell 50 from a top-view may be another rounded shape that generates shape anisotropy in the first pinned layer 35, in the second pinned layer 39, and in the composite free layer 37. To achieve high density in the STT-RAM array, the number of DSF cells 50 per cubic cm is maximized. A high density layout is realized by forming each DSF cell 50 above a via stud 30. Furthermore, the bottom electrode layer is patterned to form a bottom electrode 32 having essentially the same shape as the DSF cell 50 from a top view so that the bottom electrode occupies a minimum amount of area in the "x, y" plane.

In one embodiment where the capping layer 41 is made of Ru, a hard mask layer (not shown) such as Ta is deposited on the capping layer. The fabrication sequence used to form a DSF cell 50 typically involves coating a photoresist layer (not shown) on the hard mask. A photoresist layer is then coated and patterned to form an array of islands on the hard mask wherein each island corresponds to the desired ellipse shape or another rounded shape of a DSF cell 50. The patterned first photoresist layer then functions as an etch mask during a first reactive ion etch (RIE) process that removes uncovered regions of the hard mask layer and stops on the capping layer 41. Thereafter, the photoresist layer may be stripped and a second RIE process is employed to selectively etch through regions of the DSF stack of layers 33-41 and bottom electrode layer 32 that are not protected by the hard mask. As a result, a DSF cell 50 having a width w is formed on the first dielectric layer 31 and above via stud 30.

Figure 4:
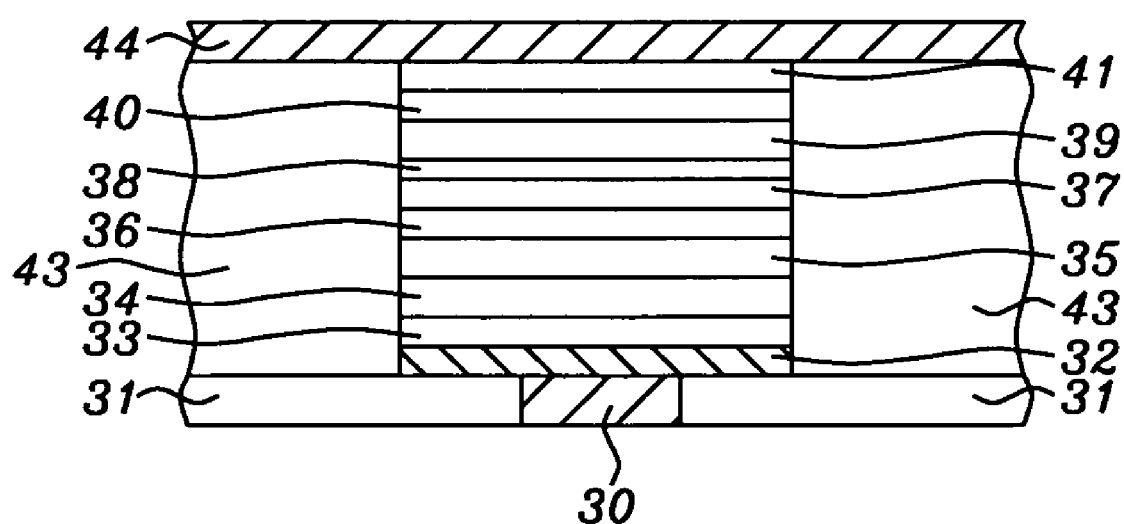
FIG. 4 is a cross-sectional view of a DSF structure formed between a top electrode and a bottom electrode in a STT-RAM device according to one embodiment of the present invention.

Referring to FIG. 4, after the etch sequence is completed, a second dielectric layer 43 made of silicon oxide, alumina, or another insulator material is deposited on the first dielectric layer 31 and on the DSF cell 50. In an embodiment where a hard mask is employed, the second dielectric layer 43 also covers the hard mask layer. Thereafter, a CMP process is used to planarize the second dielectric layer 43 to become coplanar with the capping layer 41 which may involve also removing the hard mask layer. Optionally, the CMP process may stop on the hard mask layer. In the exemplary embodiment, a conductive material such as Cu, Al, or alloys thereof may be deposited on the second dielectric layer 43 and over the capping layer 41. Next, a bit line 44 that contacts the capping layer 41 is delineated by patterning the conductive layer using a well known photoresist patterning and etching sequence.

Comparative Example 1

An experiment was conducted to demonstrate the effect of a NCC insertion layer in a conventional MTJ. In this example, the FeSiO insertion layer was RF sputtered from a $Fe_{25}(SiO_2)_{75}$ target. All three samples shown in Rows 1-3 in Table 2 were prepared with the same MgO NOX fabrication process and include a Ru/Ta/Ru capping layer. The MTJ stack is represented by a BE/NiCr45/MnPt150/CoFe24/Ru7.5/CoFeB15-CoFe6/MgO/free layer/Ru/Ta/Ru configuration where the pinned layer is CoFe/Ru/CoFeB—CoFe and the capping layer is Ru/Ta/Ru.

TABLE 2

Magnetic Properties of STT-RAM MTJ with BE/NiCr45/MnPt150/$Co_{75}Fe_{25}$24/Ru7.5/$Co_{40}Fe_{40}B_{20}$15—$Co_{75}Fe_{25}$6/MgO(NOX)/free layer/Ru/Ta/Ru configuration

| Row | FL | Anneal (2 hour) | RA | dR/R | Bs | Hc | He | Hk |
|---|---|---|---|---|---|---|---|---|
| 1 | $Co_{40}Fe_{40}B_{20}$17 | 265 C. | 7.8 | 97% | 0.50 | 9.4 | 4.9 | 29.3 |
| 2 | CoFeB14/FeSiO10/CoFeB6 | 265 C. | 11.1 | 82% | 0.53 | 13.3 | 7.0 | 35.2 |
| 3 | CoFeB15/FeSiO15/CoFeB7 | 265 C. | 11.8 | 68% | 0.53 | 10.5 | 1.7 | 27.3 |

Row 1 in Table 2 represents the reference sample while Row 2 and Row 3 have a CoFeB14/FeSiO10/CoFeB6 and a CoFeB15/FeSiO15/CoFeB7 free layer, respectively. Note that a FeSiO insertion layer causes RA to be higher, but the MR ratio is significantly decreased. Spin transfer devices were fabricated with the MTJs shown in Table 2 and were quasistatically tested. Rp for the devices with RA ~10 ohm-$\mu m^2$ and a 100 nm×150 nm (oval shape) MTJ is around 1000 ohms. For 100 nm×200 nm (oval) devices, Hc was found to be 200 Oe, 100 Oe, and 120 Oe, respectively, and the corresponding MR ratios and switching voltages (Vc_ave) are 70%(0.75V), 50%(0.2V), and 45%(0.2V) for the devices built from Row 1, Row 2, and Row 3 MTJs, respectively. Unlike the conventional CoFeB MTJ in Row 1, $Vc^+$ for AP to P switching and $Vc^-$ for P to AP switching are symmetric for the MTJs having a CoFeB/FeSiO/CoFeB free layer. More importantly, Row 2 and Row 3 MTJs display uniform distribution in all of the measurement parameters such as Rp (Rap), $V^+/V^-$, Vbd/$V^-$ (breakdown voltage), etc. Jc_ave (with 30 ms pulse) is calculated to be $6.0 \times 10^6$, $1.5 \times 10^6$, and $1.5 \times 10^6$ A/cm² for Row 1, Row 2, and Row 3 devices, respectively. After quasistatic testing, high speed measurements down to a 10 ns pulse were also made. $Jc_0$ ave of the above three devices was observed to be $7.0 \times 10^6$, $2.0 \times 10^6$, and $<2.0 \times 10^6$ A/cm². When comparing Row 2 and Row 3 MTJs, the free layer comprised of a FeSiO15 NCC insertion layer has displayed good separation between the write voltage and read voltage. Furthermore, the Row 3 structure is immune to read disturbance which means the voltage applied during reading is not able to switch the free layer magnetization state established during the write process. The primary issue for Row 2 and Row 3 MTJs is their low MR ratio. A high MR ratio is needed in order to provide a good read margin (TMR/Rp_cov) where TMR represents the MR ratio.

The present invention addresses the need to increase the MR ratio in a DSF having a composite free layer that includes a NCC layer such as FeSiO. The inventors recognized that the post deposition annealing temperature of 265° C. for the MTJs in Table 2 results in the CoFeB layers remaining in an amorphous state which is believed to produce a low MR ratio. By raising the annealing temperature to a range of 350° C. to 360° C., crystalline CoFeB layers are formed thereby increasing the MR ratio of the MTJ. Table 3 shows the magnetic performance properties of MTJs annealed at 360° C. according to the present invention.

TABLE 3

Magnetic Properties of STT-RAM MTJ with BE/NiCr45/MnPt150/Co$_{75}$Fe$_{25}$21/
Ru7.5/Co$_{40}$Fe$_{40}$B$_{20}$15—Co$_{75}$Fe$_{25}$6/MgO(NOX)/Co$_{40}$Fe$_{40}$B$_{20}$—FeSiO—Co$_{40}$Fe$_{40}$B$_{20}$/cap

| Row | FL | Cap | Anneal (2 hour) | RA | dR/R | Bs | Hc | He | Hk |
|---|---|---|---|---|---|---|---|---|---|
| 1 | CoFeB15/FeSiO10/CoFeB7 | Ta | 360 C. | 14.2 | 128% | 0.63 | 15.6 | −7.8 | 30.4 |
| 2 | CoFeB14/FeSiO10/CoFeB6 | Ta | 360 C. | 13 | 129% | 0.50 | 21.8 | 5.4 | 21.8 |
| 3 | CoFeB15/FeSiO15/CoFeB7 | Ta | 360 C. | 14 | 116% | 0.51 | 21.0 | 3.6 | 21.0 |
| 4 | CoFeB14/FeSiO10/CoFeB6 | Ru/Ta/Ru | 360 C. | 12.9 | 117% | 0.65 | 22.2 | 6.5 | 34.6 |

Comparing Row 4 of Table 3 to Row 2 of Table 2, both MTJs have a CoFeB14/FeSiO10/CoFeB6 free layer that is capped with Ru/Ta/Ru. However, the MR ratio for the 360° C. annealed MTJ is 117% vs. 82% for the 265° C. annealed MTJ. The MR ratio may be increased further as shown in Row 2 of Table 3 by employing a Ta capping layer rather than Ru/Ta/Ru. More importantly, the 360° C. annealing boosts the MR value for the Row 3 MTJ in Table 2 with the uniform distribution in measurement parameters and immunity to read disturbance as shown by the result in Row 3 of Table 3 where MR ratio has increased from 68% to 116%.

According to the present invention, the benefits derived from a MTJ having a CoFeB/FeSiO/CoFeB free layer that is annealed at a temperature of about 360° C. may be combined with the advantages of a DSF structure as described herein. In particular, DSF structures such as BE/NiCr45/CoFe/Ru/CoFeB—CoFe/MgO/free layer/Cu/CoFe/MnPt/Ta where the free layer is CoFeB/FeSiO/CoFeB or CoFe/FeSiO/CoFe are expected to retain the desirable properties of the Row 3 MTJ in Table 3 with the additional advantage of achieving a lower $Jc_0$ of $<1 \times 10^6$ A/cm². Although the CoFe/FeSiO/CoFe free layer may provide a lower $Jc_0$ because of a lower damping constant, a CoFeB/FeSiO/CoFeB free layer should lead to a higher read margin because of a higher MR ratio and larger (TMR/Rp_cov) value. As mentioned previously, other NCC layers besides FeSiO may be employed in a composite free layer to obtain similar advantages to those shown for CoFeB/FeSiO/CoFeB. Thus, the present invention teaches DSF structures that enable a combination of high MR ratio and a low intrinsic critical current density ($Jc_0$) that has not been achieved in the prior art, and a method for fabricating STT-RAM devices on a high density scale.

While this invention has been particularly shown and described with reference to, the preferred embodiment thereof, it will be understood by those skilled in the art that various changes in form and details may be made without departing from the spirit and scope of this invention.

We claim:

1. A dual spin filter (DSF) structure in a STT-RAM device, comprising:
    (a) a stack of layers formed on a bottom electrode with a top surface, said stack of layers has a certain shape in a plane parallel to said top surface, comprising;
        (1) a seed layer on the bottom electrode;
        (2) a first anti-ferromagnetic (AFM) layer that forms in direct contact with the seed layer;
        (3) a first pinned layer disposed on the first AFM layer;
        (4) a crystalline MGO tunnel barrier'
        (5) a free layer having a FM1/NCC/FM2 configuration formed on the MgO tunnel barrier where FM1 and FM2 are ferromagnetic layers made of Fe, Co, Ni, FeB, or crystalline CoFeB, and NCC is nano-current channel layer made of FeSiO, FeSiN, MSiO, MSiN, or MSiON where M is a metal and M and MSiO, MSiN, and MSiON are composites in which conductive M(Si) grains are magnetically coupled with the adjacent FM1 and FM2 layers and are formed in an oxide, nitride, or oxynitride insulator matrix, the FM1 layer contacts the tunnel barrier and the FM2 layer forms in direct contact with an overlying non-magnetic spacer;
        (6) the non-magnetic spacer layer on the free layer;
        (7) a second pinned layer formed on the non-magnetic spacer layer;
        (8) a second AFM layer on the second pinned layer; and
        (9) a capping layer wherein a Ru layer contacts the second AFM layer.

2. The DSF structure of claim 1 wherein the bottom electrode is comprised of Ta and has the same certain shape as the stack of layers.

3. The DSF structure of claim 1 wherein the first pinned layer has a configuration represented by CoFe/Ru/CoFeB—CoFe or CoFe/Ru/CoFeB and the second pinned layer is made of CoFe.

4. The DSF structure of claim 1 wherein the free layer has a configuration represented by CoFeB/FeSiO/CoFeB and the FeSiO layer has a thickness from about 8 to 15 Angstroms.

5. The DSF structure of claim 4 wherein the CoFeB layers have a Co$_{40}$Fe$_{40}$B$_{20}$ composition.

6. The DSF structure of claim 1 wherein the capping layer is comprised of Ru, Ru/Ta/Ru, or Ru/Ta.

7. The DSF structure of claim 1 wherein the certain shape is elliptical or another rounded shape that imparts a substantial shape anisotropy to the free layer and pinned layers.

8. The DSF structure of claim 1 wherein the bottom electrode has a bottom surface that contacts a via stud which is electrically connected to a transistor drain.

9. The DSF structure of claim 1 wherein the non-magnetic spacer is comprised of Cu.

10. The DSF structure of claim 1 wherein the FM1 and FM2 layers have a FeB composition represented by $FeB_x$ where x is from 0 to about 5 atomic %.

11. The DSF structure of claim 1 wherein the FM1 layer has a thickness greater than or equal to a thickness of the FM2 layer.

* * * * *